United States Patent
Lee

(10) Patent No.: US 7,396,738 B1
(45) Date of Patent: Jul. 8, 2008

(54) METHOD OF FORMING ISOLATION STRUCTURE OF FLASH MEMORY DEVICE

(75) Inventor: Jae Jung Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/610,484

(22) Filed: Dec. 13, 2006

(51) Int. Cl.
*H01L 21/76* (2006.01)

(52) U.S. Cl. .............. 438/427; 438/424; 438/426

(58) Field of Classification Search ............ 438/424, 438/426, 427
See application file for complete search history.

(56) References Cited

U.S. PATENT DOCUMENTS

| 7,179,717 | B2 * | 2/2007 | Sandhu et al. | 438/424 |
| 2006/0008993 | A1 * | 1/2006 | Song et al. | 438/268 |
| 2007/0026629 | A1 * | 2/2007 | Chen et al. | 438/424 |
| 2007/0155124 | A1 * | 7/2007 | Ahn et al. | 438/424 |
| 2008/0003775 | A1 * | 1/2008 | Yamada et al. | 438/427 |

FOREIGN PATENT DOCUMENTS

| KR | 1020030049357 A | 6/2003 |
| KR | 1020030056602 A | 7/2003 |
| KR | 1020040040528 A | 5/2004 |

\* cited by examiner

*Primary Examiner*—Matthew S. Smith
*Assistant Examiner*—John M Parker
(74) *Attorney, Agent, or Firm*—Townsend and Townsend and Crew LLP

(57) ABSTRACT

A method of forming a semiconductor memory device includes providing a semiconductor substrate having a cell region and a peripheral region. A gate dielectric layer is formed over the semiconductor substrate in the peripheral region. An insulating layer is formed over the gate dielectric layer. An isolation trench is formed in the peripheral region, the isolation trench defining first and second trenches having different opening widths. A first gap-fill layer is provided over the isolation trench and on the step. The first gap-fill layer has a first portion on a sidewall of the insulating layer, a second portion on a sidewall of the gate dielectric layer, and a third portion at least partly filling the second trench of the isolation trench, the second portion being thicker than the first portion. A wet etch is performed to remove at least part of the first gap-fill layer. A second gap-fill layer is provided over the first gap-fill layer in the isolation trench to form an isolation structure. The second portion of the first gap-fill layer is configured to protect the gate dielectric layer during the wet etch step.

19 Claims, 3 Drawing Sheets

METHOD OF FORMING ISOLATION STRUCTURE OF FLASH MEMORY DEVICE

BACKGROUND OF THE INVENTION

The present invention relates to a method of manufacturing semiconductor devices, and more particularly, to a method of forming an isolation structure of a flash memory device.

In general, as the size of a flash memory device shrinks, it is required that the depth of the isolation structure of the cell region be set different from those of the peri-region in the formation process of the isolation structure.

In the process of forming the isolation structures of the cell region and the peri region, which have different depths, a high density plasma (HDP) oxide layer is generally used as an insulating layer for trench gap-fill. This is done to prevent gap-fill failure in the trench of the cell region, which has a smaller opening than that of the trench of the peri region. A wet etch-deposition method is also used.

If the wet etch process is performed on the trench of the peri region, which has a depth deeper than that of the trench of the cell region, neighboring gate oxide layers may also be removed when the deposited insulating layer is stripped. This degrades the reliability of the device.

SUMMARY OF THE INVENTION

An embodiment of the present invention relates to a method of forming an isolation structure of a flash memory device which can prevent the loss of the gate oxide layer (or gate dielectric layer) during the process of forming isolation structures of different depths in the cell region and peri region. In one embodiment, a sidewall mask is provided on the gate oxide layer by forming a lip/step in a peri-region isolation trench.

In one embodiment, a method of forming a semiconductor memory device includes providing a semiconductor substrate having a cell region and a peripheral region, the cell region configured to define a plurality of memory cells. First and second gate dielectric layers are formed over the semiconductor substrate in the cell region and peripheral region, respectively. An insulating layer is formed over at least the second gate dielectric layer. An isolation trench is formed in the peripheral region, the isolation trench defining a first trench and a second trench provided below the first trench. The first trench extends below the second gate dielectric layer and exposes the second gate dielectric layer. The second trench has a smaller opening then the first trench, wherein a step is defined at an interface between the first and second trenches. A first gap-fill layer is provided over the isolation trench and on the step. The first gap-fill layer has a first portion on a sidewall of the insulating layer, a second portion on a sidewall of the second gate dielectric layer and over the step, and a third portion at least partly filling the second trench of the isolation trench. The second portion is thicker than the first portion. A wet etch is performed to remove at least part of the first gap-fill layer. A second gap-fill layer is provided over the first gap-fill layer in the isolation trench to form an isolation structure. The second portion of the first gap-fill layer is configured to protect the second gate dielectric layer during the wet etch step.

In one embodiment, the wet etch step removes substantially all the first portion of the first gap-fill to increase a gap-fill margin. The step is provided below the second gate dielectric layer. The second gate dielectric layer is an oxide and the insulating layer is a nitride. An isolation trench is formed in the cell region, the isolation trench in the cell region having a different depth than that of the isolation trench in the peripheral region.

In another embodiment, a method of forming a semiconductor memory device includes providing a semiconductor substrate having a cell region and a peripheral region. A gate dielectric layer is formed over the semiconductor substrate in the peripheral region. An insulating layer is formed over the gate dielectric layer. An isolation trench is formed in the peripheral region, the isolation trench defining first and second trenches having different opening widths. A first gap-fill layer is provided over the isolation trench and on the step. The first gap-fill layer has a first portion on a sidewall of the insulating layer, a second portion on a sidewall of the gate dielectric layer, and a third portion at least partly filling the second trench of the isolation trench, the second portion being thicker than the first portion. A wet etch is performed to remove at least part of the first gap-fill layer. A second gap-fill layer is provided over the first gap-fill layer in the isolation trench to form an isolation structure. The second portion of the first gap-fill layer is configured to protect the gate dielectric layer during the wet etch step.

In another embodiment, a step is provided at an interface between the first and second trenches. The second portion of the first gap-fill layer is provided on the step. The first trench extends below the gate dielectric layer and into the semiconductor substrate. The second trench is provided below the first trench. The first trench has a wider opening than that of the second trench.

DESCRIPTION OF SPECIFIC EMBODIMENTS

The present invention will now be described in detail in connection with certain embodiments with reference to the accompanying drawings. To clarify multiple layers and regions, the thickness of the layers is not drawn to scale. When it is said that any part (e.g., a layer, film, area, or plate) is positioned on another part, it means the part is directly on the other part or above the other part with at least one intermediate part. On the other hand, if any part is said to be positioned directly on another part it means that there is no intermediate part between the two parts.

Figure 1:
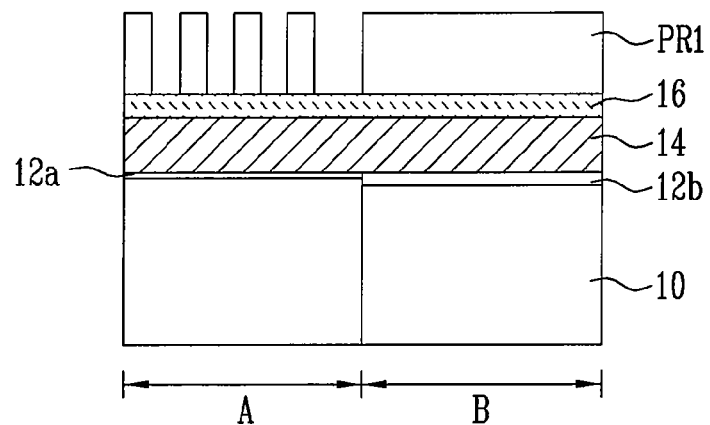
FIGS. 1 to 8 are cross-sectional views illustrating a method of forming an isolation structure of a flash memory device according to an embodiment of the present invention.

Referring to FIG. 1, a gate oxide layer is formed on a semiconductor substrate 10 in which a cell region A and a peri region (or peripheral region) B are defined. A low voltage gate oxide layer 12a is formed in the cell region A and a high voltage gate oxide layer 12b is formed in the peri region B. The gate oxide layer 12a and the gate oxide layer 12b are formed by common processes for forming low and high voltage gate oxide layers.

A nitride layer 14 for a hard mask and an oxide layer 16 for a hard mask are then formed on the gate oxide layer 12a and the gate oxide layer 12b. The nitride layer 14 may be formed to a thickness of 300 to 1000 Å and the oxide layer 16 may be formed to a thickness of 200 to 600 Å.

A photoresist pattern PR1 for defining the cell region isolation structure is then formed on the oxide layer 16. The photoresist pattern PR1 is an etch mask used to etch the cell region A and define an isolation structure in the cell region A. The pattern PR1 covers or masks the peri region B, so that the region B is not etched.

Figure 2:
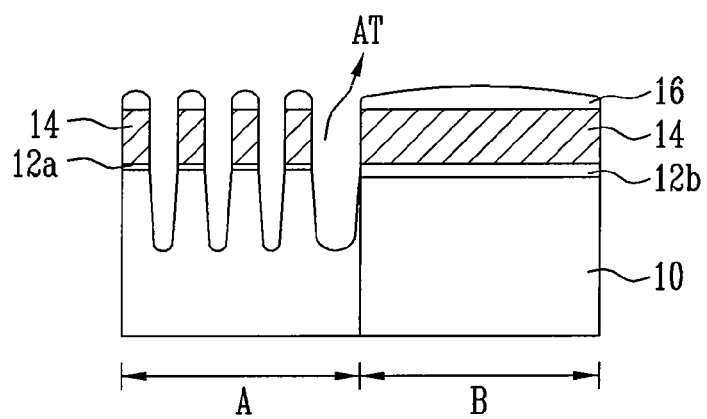

Referring to FIG. 2, the oxide layer 16, the nitride layer 14, the gate oxide layer 12a, and a given depth of the semiconductor substrate 10 are etched using the pattern PR1 as the etch mask. A cell region trench AT is formed. Each of the celli-region trenches AT may have a depth ranging from about 1000 to 2000 Å. An ashing process is performed to remove the pattern PR1.

Figure 3:
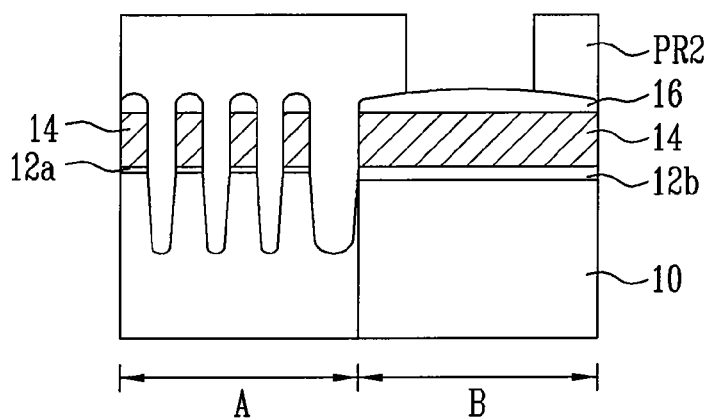

Referring to FIG. 3, a photoresist pattern PR2 for defining a peri region isolation structure is formed on the resulting surface in which the celli-region trenches AT are formed.

Figure 4:
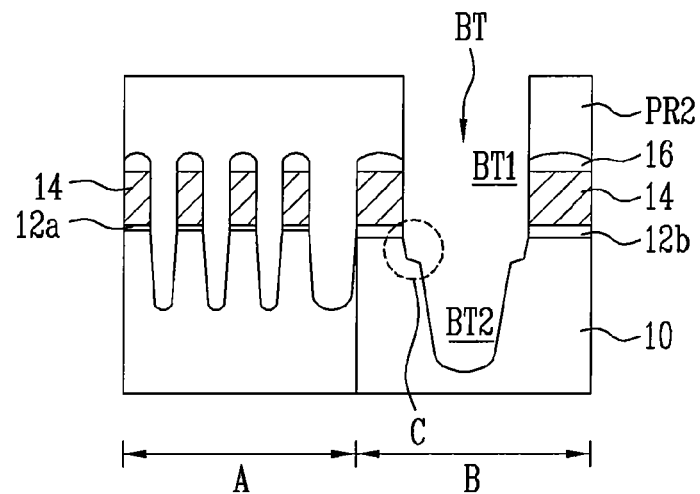

Referring to FIG. 4, the oxide layer 16, the nitride layer 14, the gate oxide layer 12b, and a given depth of the semiconductor substrate 10 are etched using the pattern PR2 as an etch mask. A peri-region trench BT is formed. The peri-region trench BT includes a first trench BT1 and a second trench BT2, where the second trench BT2 is provided below the first trench BT1. The first trench BT1 extends below the gate oxide layer 12b and into the substrate 10. The first trench BT1 has a wider opening than that of the second trench BT2. As a result, a step or lip C is defined at the interface between the first and second trenches BT1 and BT2.

The first and second trenches BT1 and BT2 of the peri-region trench BT is formed through a multi-step etch process. This etch process for forming the trench BT includes first, second, and third steps in the present implementation. The second etch step may uses RF bias power 150 to 500% higher than that of the first and third steps, or an etch gas (e.g., a gas including $CHF_3$) with a high selectivity against the semiconductor substrate.

During the etching steps excess byproducts are generated, which are deposited on the sidewall of the pattern PR2. This causes the mask opening of the trench to get smaller as the etching process gets deeper. The buildup on the sidewall of the pattern PR2, coupled with the three step etching process, creates the lip C in the peri-region trench BT. The first etch step is removing oxide hard mask and silicon nitride hard mask using $CF_4$, $CHF_3$, $O_2$, Ar gas plasma. And the second step is etching the thin gate oxide film using $CF_4$, $CHF_3$, Ar gas plasma and during the excessive over etching time the Si top substrate is tapered. And the third Step is Si trench etching using HBr, $Cl_2$, $O_2$ gas plasma.

The peri-region trench BT has a depth of about 2050 to 5000 Å in the present implementation, but may have a different depth in other implementations. An ashing process is performed to strip the pattern PR2.

Figure 5:
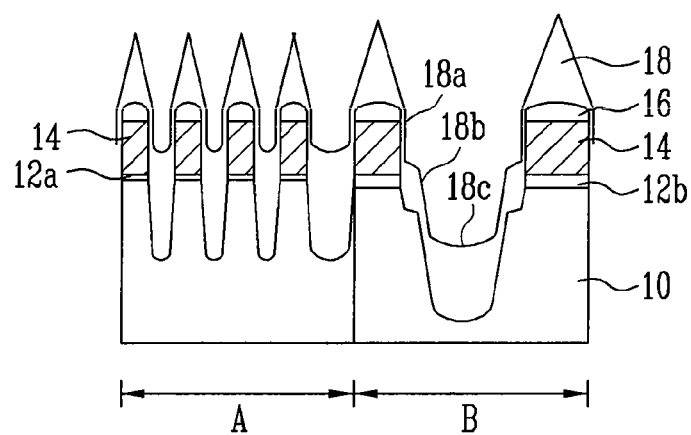

Referring to FIG. 5, a HDP oxide film 18 (i.e., a first insulating layer for trench gap-fill or first gap-fill layer) is formed on the resulting surface in which the trench BT is formed. The first insulating layer 18 is gap-filled in the cell-region trench AT and the peri-region trench BT to a given thickness. The first insulating layer 18 includes three different portions in the peri-region trench BT. A first portion 18a is formed on the sidewalls of the oxide layer 16 and the nitride layer 14. A second portion 18b is formed on the lip C and provided below the first portion 18a. A third portion 18c at least partly fills the second trench BT2 and is provided below the second portion 18b.

The second portion 18b (or sidewall mask) is on the sidewall of the gate oxide layer 12b to prevent the loss of the gate oxide layer in the subsequent wet-etch process. The second portion 18b also partly covers the nitride layer 14 and the substrate 10. The thickness of the second portion 18b is greater than that of the first portion 18a. In the present embodiment, the first portion 18a has a thickness of 500 A~1500 Å, and the second portion 18b has a thickness of 500 A~3000 A. This extra thickness is used to protect the gate oxide layer 12b, as explained below.

Figure 6:
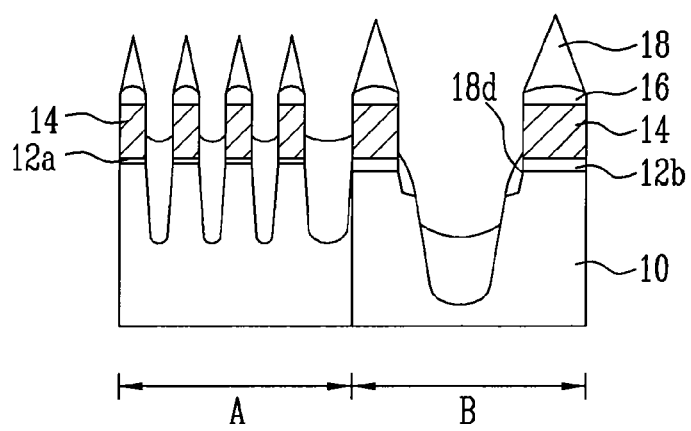

Referring to FIG. 6, a wet etch process is performed to partly remove the first insulating layer 18. The first portion 18a of the first insulating layer 18 that has been formed on the sidewalls is removed. The sidewalls of the oxide layer 16 and the nitride layer 14 (at least partly) are exposed. The removal of the first portion 18a improves the gap-fill margin of a second insulating layer (refer to numeral 20 in FIG. 7) to be deposited subsequently.

The second portion 18b is provided with sufficient thickness, so that the wet etch process cannot remove the second portion 18b entirely. That is, a part 18d of the second portion 18d remains on the sidewall of the gate oxide 12b to protect the high voltage gate oxide 12b from the wet etch process.

Figure 7:
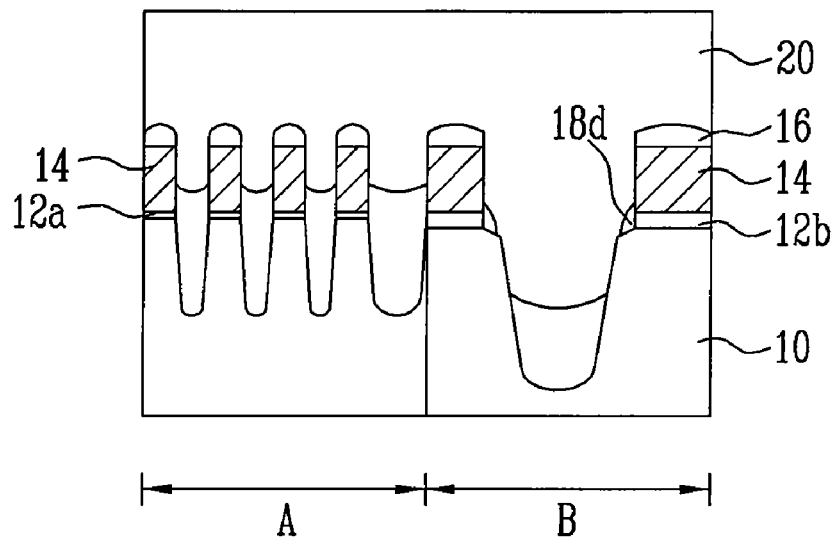
Figure 8:
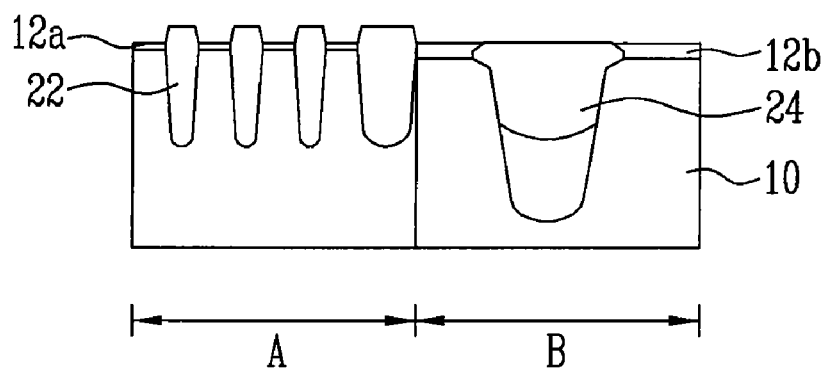

Referring to FIG. 7, a HDP oxide layer 20 (i.e., the second insulating layer for trench gap-fill or second gap-fill layer) is formed on the resulting surface on which the wet etch process has been performed. The gap-fill margin is improved since the second insulating layer 20 is formed after the first insulating layer formed on the sidewalls is striped by the wet etch process Referring to FIG. 8, a polishing process such as chemical-mechanical polishing (CMP) is performed on the resulting surface on which the second insulating layer 20 is formed until the oxide layer 16 is exposed. The exposed oxide layer 16 and the underlying nitride layer 14 are removed to form isolation structures 22 of the cell region and an isolation structure 24 of the peri region. The isolation structure 24 of the peri-region has two gap-fill layers: the first gap-fill layer 18 and the second gap-fill layer 20.

As described above, according to the present invention, the peri-region trench has a lip. The first gap-fill layer is deposited on the lip of the peri-region trench to form a sidewall mask to protect the high voltage gate oxide layer from a wet etch process for gap-filling the trench. It is therefore possible to prevent the loss of the gate oxide layer during the isolation structure formation process of the cell region and the peri region with different depths.

While the invention has been described using specific embodiments, it is to be understood that the invention is not limited to the disclosed embodiments, but is intended to cover various modifications and arrangements within the spirit and scope of the appended claims.

What is claimed is:

1. A method of forming a semiconductor memory device, the method comprising:

providing a semiconductor substrate having a cell region and a peripheral region, the cell region configured to define a plurality of memory cells;

forming first and second gate dielectric layers over the semiconductor substrate in the cell region and peripheral region, respectively;

forming an insulating layer over at least the second gate dielectric layer;

forming an isolation trench in the peripheral region, the isolation trench defining a first trench and a second trench provided below the first trench, the first trench extending below the second gate dielectric layer and exposing the second gate dielectric layer, the second trench having a smaller opening then the first trench, wherein a step is defined at an interface between the first and second trenches;

providing a first gap-fill layer over the isolation trench and on the step, the first gap-fill layer having a first portion on a sidewall of the insulating layer, a second portion on a sidewall of the second gate dielectric layer and over the step, and a third portion at least partly filling the second trench of the isolation trench, the second portion being thicker than the first portion;

performing a wet etch to remove at least part of the first gap-fill layer; and providing a second gap-fill layer over the first gap-fill layer in the isolation trench to form an isolation structure, wherein the second portion of the first gap-fill layer is configured to protect the second gate dielectric layer during the wet etch step.

2. The method of claim 1, wherein the wet etch step removes substantially all the first portion of the first gap-fill to increase a gap-fill margin.

3. The method of claim 1, wherein the second gate dielectric layer is thicker than the first gate dielectric layer.

4. The method of claim 1, wherein the second gate dielectric layer is an oxide and the insulating layer is a nitride.

5. The method of claim 1, further comprising:

forming an isolation trench in the cell region, the isolation trench in the cell region having a different depth than that of the isolation trench in the peripheral region.

6. The method of claim 5, wherein the isolation trench in the cell region is formed before the isolation trench in the peripheral region.

7. The method of claim 6, wherein the isolation trench of the cell region has a smaller opening than that of the first trench of the isolation trench of the peripheral region.

8. The method of claim 1, wherein the first gate dielectric layer is configured to handle to a lower voltage than the second gate dielectric layer.

9. The method of claim 1, wherein the first gap-fill layer includes a HDP oxide film.

10. The method of claim 1, wherein the second gap-fill layer includes a HDP oxide film.

11. The method of claim 1, wherein the second portion has a thickness of 500 angstroms to 3000, laterally.

12. The method of claim 1, wherein the isolation trench of the peripheral region is formed using at least two different etch steps.

13. The method of claim 12, wherein the isolation trench of the peripheral region is formed using at least first, second, and third etch steps, wherein the second etch step uses RF bias power that is about 150 to 500% higher than that of the first etch step.

14. The method of claim 13, wherein the second etch step uses an etch gas that has a high selectivity against the semiconductor substrate.

15. The method of claim 14, wherein the etch gas of the second etch step includes $CHF_3$.

16. The method of claim 1, wherein the device is a flash memory device.

17. A method of forming a semiconductor memory device, the method comprising:

providing a semiconductor substrate having a cell region and a peripheral region;

forming a gate dielectric layer over the semiconductor substrate in the peripheral region;

forming an insulating layer over the gate dielectric layer;

forming an isolation trench in the peripheral region, the isolation trench defining first and second trenches having different opening widths;

providing a first gap-fill layer over the isolation trench and on the step, the first gap-fill layer having a first portion on a sidewall of the insulating layer, a second portion on a sidewall of the gate dielectric layer, and a third portion at least partly filling the second trench of the isolation trench, the second portion being thicker than the first portion;

performing a wet etch to remove at least part of the first gap-fill layer; and providing a second gap-fill layer over the first gap-fill layer in the isolation trench to form an isolation structure, wherein the second portion of the first gap-fill layer is configured to protect the gate dielectric layer during the wet etch step.

18. The method of claim 17, wherein a step is provided at an interface between the first and second trenches and the second portion of the first gap-fill layer is provided on the step.

19. The method of claim 18, wherein the first trench extends below the gate dielectric layer and into the semiconductor substrate, and the second trench being provided below the first trench, the first trench having a narrower opening than that of the second trench.

* * * * *